United States Patent [19]

Matsushita et al.

[11] Patent Number: 5,172,851
[45] Date of Patent: Dec. 22, 1992

[54] METHOD OF FORMING A BUMP ELECTRODE AND MANUFACTURING A RESIN-ENCAPSULATED SEMICONDUCTOR DEVICE

[75] Inventors: Akira Matsushita, Zyouyou; Hidekazu Konishi, Ibaraki, both of Japan

[73] Assignee: Matsushita Electronics Corporation, Osaka, Japan

[21] Appl. No.: 761,717

[22] Filed: Sep. 17, 1991

[30] Foreign Application Priority Data

Sep. 20, 1990 [JP] Japan ................................ 2-252316
Oct. 9, 1990 [JP] Japan ................................ 2-271346

[51] Int. Cl.[5] .................. H01L 21/607; B23K 101/40
[52] U.S. Cl. ....................................... 228/179; 228/4.5
[58] Field of Search ............... 228/176, 180.2, 4.5, 228/1.1, 179, 253, 254, 111; 29/856

[56] References Cited

U.S. PATENT DOCUMENTS

| | | | |
|---|---|---|---|
| 3,357,090 | 12/1967 | Tiffany | 228/4.1 |
| 3,672,047 | 6/1972 | Sakamoto et al. | 228/254 |
| 4,442,967 | 4/1984 | van de Pas et al. | 228/179 |
| 4,717,066 | 1/1988 | Goldenberg et al. | 228/4.5 |
| 4,750,666 | 6/1988 | Neugebauer et al. | 228/4.5 |
| 4,776,509 | 10/1988 | Pitts et al. | 228/1.1 |
| 4,857,483 | 8/1989 | Steffen et al. | 29/856 |
| 4,886,200 | 12/1989 | Tsumura | 228/1.1 |
| 5,060,843 | 10/1991 | Yasuzato et al. | 228/4.5 |

FOREIGN PATENT DOCUMENTS

| | | | |
|---|---|---|---|
| 55-151344 | 11/1980 | Japan | 228/179 |
| 60-194543 | 10/1985 | Japan . | |
| 61-78128 | 4/1986 | Japan | 228/1.1 |
| 62-152142 | 7/1987 | Japan . | |
| 62-152143 | 7/1987 | Japan . | |
| 62-154648 | 7/1987 | Japan . | |
| 63-173345 | 7/1988 | Japan . | |
| 63-304587 | 12/1988 | Japan . | |

Primary Examiner—Richard K. Seidel
Assistant Examiner—Jeanne M. Elpel
Attorney, Agent, or Firm—Ratner & Prestia

[57] ABSTRACT

A bump electrode having a protrusion is formed. The protrusion is made of a folded wire whose tail is bonded to a cavity on the base of the bump electrode. A method of manufacturing a resin-sealed semiconductor device encapsulating a chip equipped with bump electrodes is also presented.

14 Claims, 16 Drawing Sheets

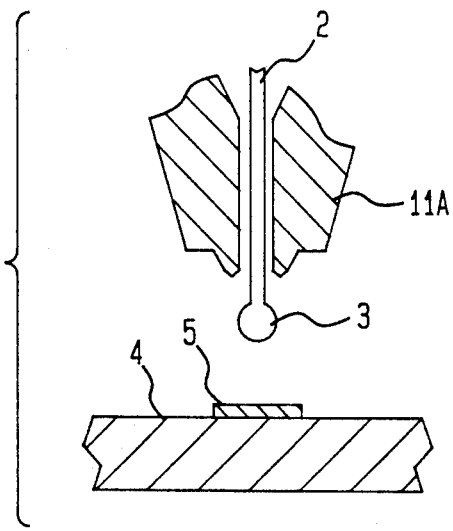
FIG. 1A
FIG. 1B
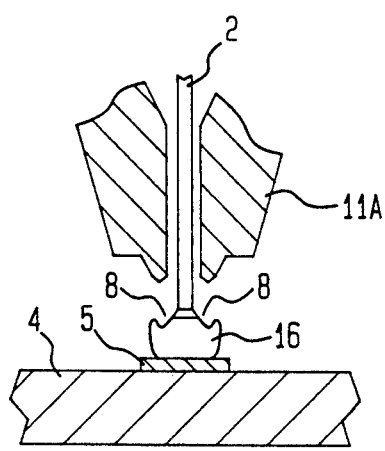
FIG. 1C
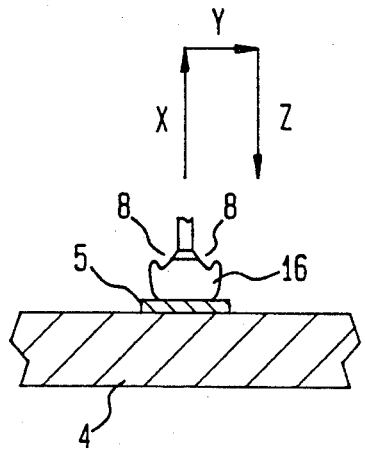
FIG. 1D
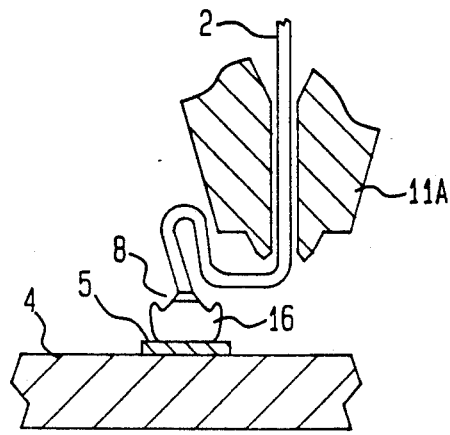

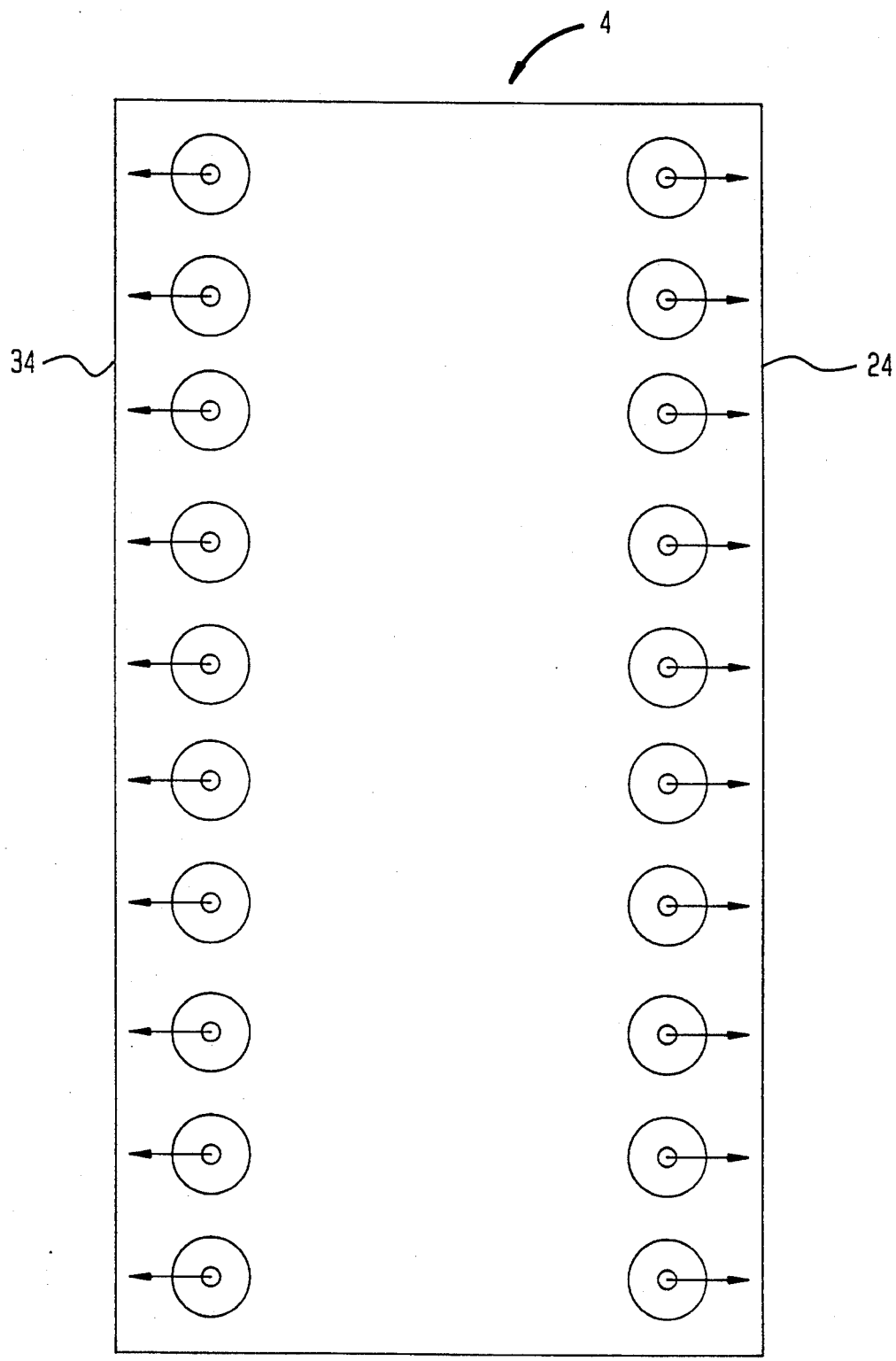

METHOD OF FORMING A BUMP ELECTRODE AND MANUFACTURING A RESIN-ENCAPSULATED SEMICONDUCTOR DEVICE

FIELD OF THE INVENTION

The present invention relates to a method of forming a bump electrode on a pad electrode of a semiconductor chip. The invention also relates to a method of making a resin-encapsulated semiconductor device having bump electrodes.

BACKGROUND OF THE INVENTION

In order to meet the increasing needs for more I/O pins with narrower pitches in the field of semiconductor packages, a technique called "stud bump method" is known. This is a method of forming an electrode on semiconductor chips. This technique is specifically disclosed in the Japanese Laid-open Patent No. 63-304587 (1988). A summary thereof is described below.

FIGS. 18(a) through 18(d) are process sectional views for explaining the bump electrode forming process of the prior art.

As shown in FIG. 18(a), a ball 3 is formed by an electric torch on the tip of the wire 2 drawn out from the tip of a bonding capillary 1. As shown in FIG. 18(b), the ball 3 is bonded to an electrode pad 5 on an LSI chip substrate 4 by the capillary 1, and a base part 6 is formed. In succession, as shown in FIG. 18(c) and FIG. 18(d), the wire connected to the base is passed into the hole of the capillary, the capillary is moved in a loop form, and a protrusion is formed with folded wire 2 on the base part 6. By subsequent cutting of the wire, a bump electrode is completed.

FIG. 19 is a sectional view of a bump electrode formed by this method. Since the top surface of the base 6 is flat, the force to retain the tail of the bonded wire 2 is insufficient, and due to the movement of the capillary (when cutting off the wire after bonding the tail), the tail of the wire is often dislocated from the base 6. As a result, the shape of the obtained bump electrode is not as specified. Because reformation of the electrode is practically impossible, LSI chips having such a bump electrode must be discarded as defective products.

SUMMARY OF THE INVENTION

Therefore the prime object of the present invention is to provide a method for forming a bump electrode without a deformation of the folded wire.

This is accomplished according to the present invention by an improved method for forming a bump electrode. This method comprises the steps of forming a swollen head at the tip of a metal wire drawn out from the tip of a capillary; pressing the swollen head to a pad electrode on a semiconductor chip by the tip of said capillary to crush said swollen head, thereby bonding said swollen head and said pad electrode, causing the crushed swollen head to become the base part of the bump electrode, and forming a cavity on the top surface of the base part; moving the capillary in a loop forming motion above the base part, and folding back the wire extending from the base part toward the base part; pressing and bonding the folded-back wire to the cavity by the tip of the capillary; and cutting off the wire further extending from the bonded part.

In a preferred embodiment, the loop-forming motion of the capillary comprises the steps of moving the capillary vertically upward, shifting the capillary horizontally, and moving the capillary vertically downward.

In an exemplary embodiment, the cavity is annularly formed surrounding the wire root.

In another exemplary embodiment, the cavity is formed only at one position around the wire root.

In still another exemplary embodiment, the cavity is formed at two positions at both sides of the wire root.

In a further exemplary embodiment, the cavity is formed at four positions at a spacing of 90 degrees mutually about the wire root.

In a still further exemplary embodiment, one of the cavities formed in the bump electrode is formed at the closest side of the semiconductor chip on which the bump electrode is formed by reference to the wire root of the bump electrode.

In an alternate exemplary embodiment, the direction of the horizontal shift of the capillary is vertical and toward the nearest side of the semiconductor chip.

According to the invention, an alternative method of forming a bump electrode comprises the steps of: forming a swollen head at the tip of a metal wire drawn out from the tip of a capillary; pressing the swollen head to a pad electrode of a semiconductor chip by the tip of the capillary to crush the swollen head, thereby bonding the crushed swollen head and the pad electrode, wherein the crushed swollen head becomes the base part of a bump electrode; moving the capillary in a loop forming motion above the base part, and cutting off the wire extending from the base part at the vicinity of its root part, thereby forming a protrusion.

In an exemplary embodiment, the loop forming motion of the capillary comprises the steps of: moving the capillary vertically upward, shifting the capillary horizontally, and moving the capillary vertically downward.

According to the present invention, a method of manufacturing a resin-sealed semiconductor device comprises the steps of: forming a bump electrode on an electrode pad of a semiconductor chip, wherein the bump electrode comprises a base part and a protrusion above the base part; bonding an end of a lead member to the protrusion of the bump electrode, thus joining the two electrically; and covering at least the semiconductor chip and the electrically joined parts with resin mold, thereby forming a resin body from which the other end of the lead member is drawn out.

According to this invention, a method of manufacturing a resin-sealed semiconductor device comprises the steps of forming a bump electrode according to the method described above on an electrode pad of a semiconductor chip, wherein the direction of the horizontal shift of the capillary is matched with the axial direction in the longitudinal direction of the lead member to be joined to the bump electrode; bonding an end of the lead member to the protrusion of the bump electrode to join the two electrically; and covering at least the semiconductor chip and the electrically joined parts with resin mold, thereby forming a resin body from which the other end of the lead member is drawn out.

BRIEF DESCRIPTION OF THE DRAWINGS

The foregoing and other objects of the invention may be better understood from the following detailed description thereof, when read in conjunction with the accompanying drawings wherein:

FIGS. 1(a) to 1(d) are sectional views showing the process steps of an embodiment of the invention, FIGS. 6 and 7 are plan views showing the configuration of two rows of bump electrodes on a semiconductor chip.

DETAILED DESCRIPTION OF THE PREFERRED EMBODIMENTS

Figure 2:
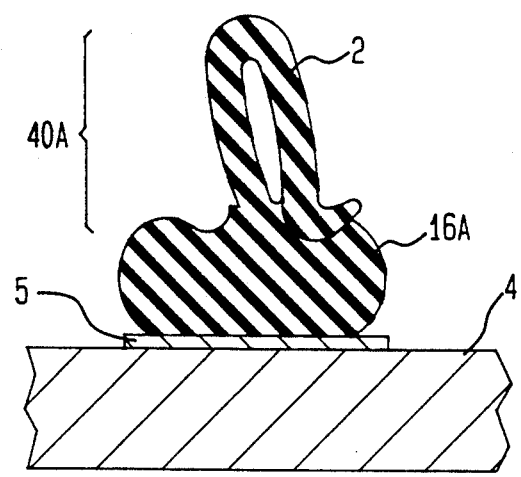
FIG. 2 shows a sectional view of a bump electrode.

FIGS. 1(a) through 1(d) are sectional views showing the forming process of a bump electrode according to an embodiment of the present invention. An electrode pad 5 on the LSI chip substrate 4 on which bump electrodes are to be formed is made of an alloy composed mainly of aluminum. The electrode pad 5 has a thickness of about 0.8 $\mu$m and a size of about 94 $\mu$m × 94 $\mu$m. This electrode pad 5 is usually disposed in the peripheral part of an LSI chip. The electrode pad 5 is isolated from the silicon substrate 4 or an impurity diffusion region in the substrate by way of a silicon dioxide film (not shown). In addition, the electrode pad 5 is electrically connected to a circuit incorporated in an LSI chip as a semiconductor chip.

The apparatus for forming a bump electrode may be any wire bonder conventionally used in the so-called nail-head bonding. An exemplary wire bonder is model 1484, manufactured by K&S Corp. As a bonding capillary, although a ceramic bonding capillary which is conventionally used in gold wire nail-head bonding can be used, a capillary having a protrusion surrounding the wire outlet (as shown in FIG. 1) is preferable. Typical dimensions of a capillary are as follows:

tip diameter : 203 $\mu$m
hole diameter : 38 $\mu$m
outer radius: 38 $\mu$m

A gold wire of 30 $\mu$m in diameter (purity: 99.9999%) is used. An exemplary gold wire is model MHGLP-101, manufactured by Tanaka Denshi Kogyo.

As shown in FIG. 1(a), a wire 2 is drawn out from the wire outlet at the tip of a capillary 11A, and the wire tip is melted by an electric spark to form a ball 3 (with a swollen head). The spark is generated with an applied voltage of about 3 to 4 kV and a gap of about 380 $\mu$m. The diameter of this ball is about 50 to 70 $\mu$m.

As shown in FIG. 1(b), the ball is pressed against the electrode pad 5 by the tip of the capillary 11A. At this step, the LSI chip provided with the electrode pad is heated to about 180° C. The ball is pressed by the capillary with a force of about 45 to 50 grams, and the capillary is further subjected to an ultrasonic vibration of about 60 kHz. When bonded in such a manner, the junction surface of the crushed ball and the electrode pad is circular (about 60 to 80 $\mu$m in diameter). The crushed and bonded ball becomes a base part 16 of the bump electrode. On the top surface of the base part 16, the protrusion of the capillary tip is pressed, and an annular cavity 8 is formed surrounding the connecting point with the wire (wire root). The depth of the cavity is about 5 to 20 $\mu$m.

Next, as shown in FIG. 1(c), with the wire extending from the base part and through the capillary, the capillary is moved so as to draw a loop trace. The movement of the capillary at this step is analyzed into individual motions as follows:

X: vertically upward (200 to 500 $\mu$m)
Y: shifted horizontally (120 to 150 $\mu$m)
Z: vertically downward (200 to 500 $\mu$m)

Figure 18A:
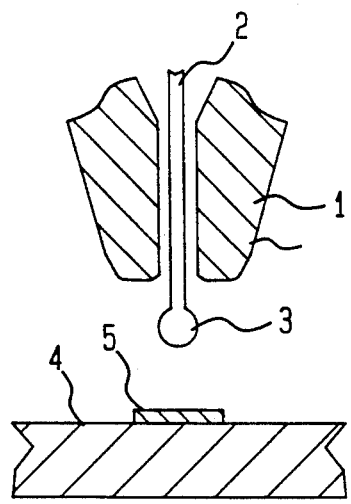
FIGS. 18(a) to 18(d) are sectional views showing the process steps of the prior art.
Figure 18B:
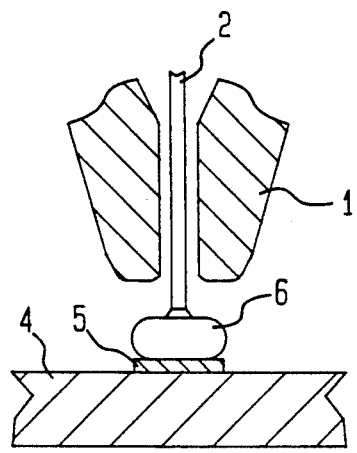
Figure 18C:
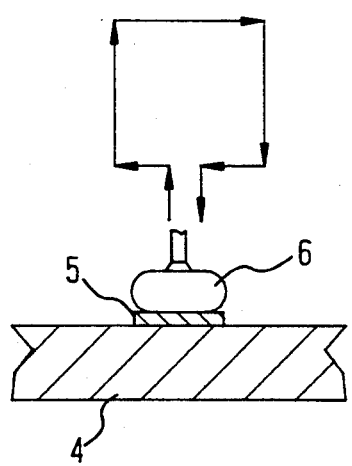
Figure 18D:
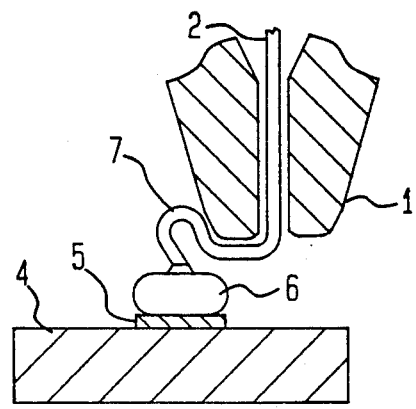

FIG. 1(d) is a sectional view showing the configuration just before the end of the downward motion Z. The tail of the wire folded back in a loop form by this series of motions is bonded to the cavity in the upper surface of the base part by the vertical downward movement. The force for the tail bonding is about 90 to 100 grams. The part formed on the top of the base part by this folded-back wire becomes the protrusion of the bump electrode. The height of the bump electrode including this protrusion is about 60 to 90 $\mu$m. By skipping the horizontal motion prior to the vertical upward motion (as in the prior art of FIG. 18(c)), the uniformity of the folded wire (protrusion) is improved.

Consequently, the wire is cramped, the capillary is moved away from the base part, and the wire further extending from the bonded tail is cut off. FIG. 2 is a cross-sectional view of a resultant bump electrode. The crushed ball makes a base part 16A and the folded wire forms a protrusion part 40A. Since the wire tail is bonded to the cavity, the junction strength is sufficiently large. Accordingly, dislocation of the wire 2 from the base part 16A is decreased in incidence by this process.

Another effect of forming a cavity on the top of the base part of the bump electrode is the improvement of the buffer capacity against mechanical impact. Mechanical impact or stress caused by bonding of the lead member to the bump electrode for packaging is absorbed, to some extent, by the protrusion of the bump electrode. But, because of the cavity formed around the root of the wire, the plastic fluidity near the portion for supporting the protrusion is made easy, and the buffer capacity is enhanced.

FIGS. 3(a) through 3(d) show sectional views of a bump electrode formed according to a second embodiment of this invention. In this embodiment, a cavity 8 is formed only in part of the top surface of the base part 16B, and the tail of the wire is bonded to the cavity. The bump electrode in such shape can be formed in the same manner in the above embodiment by employing a capillary 11B having a protrusion only in the part of the circumference of the wire outlet.

Figure 4:
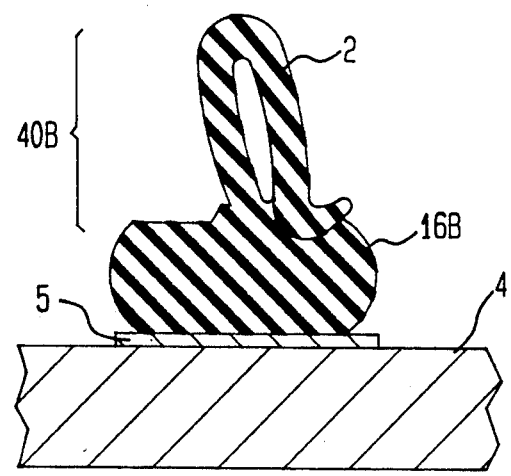
FIG. 4 shows a sectional view of a bump electrode.
Figure 3A:
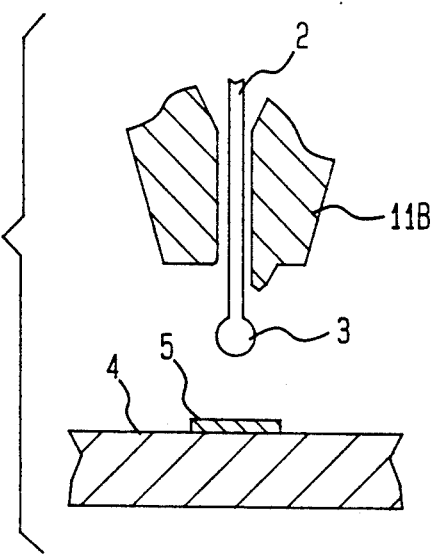
FIGS. 3(a) to 3(d) are sectional views showing the process steps of another embodiment of the invention.
Figure 3B:
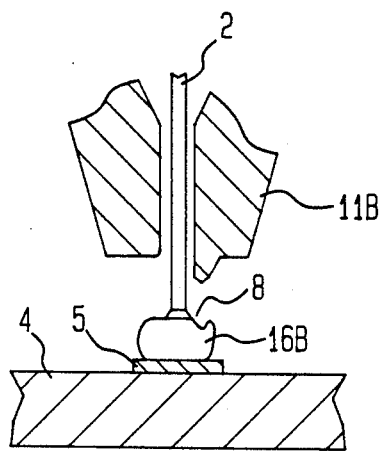
Figure 3C:
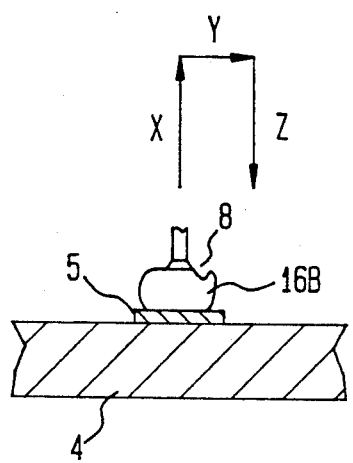
Figure 3D:
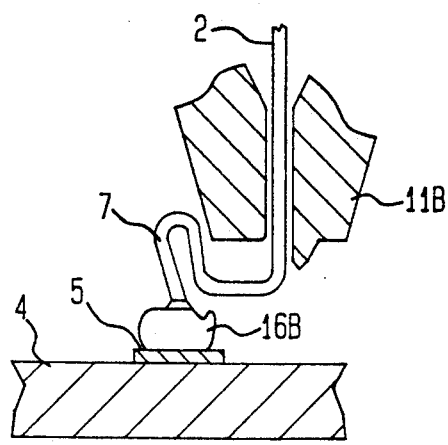

FIG. 4 is a sectional view of a bump electrode formed according to the second embodiment of this invention. The tail of the wire 2 is bonded to the cavity formed at a selected part of the top surface of the base part 16B.

Figure 5:
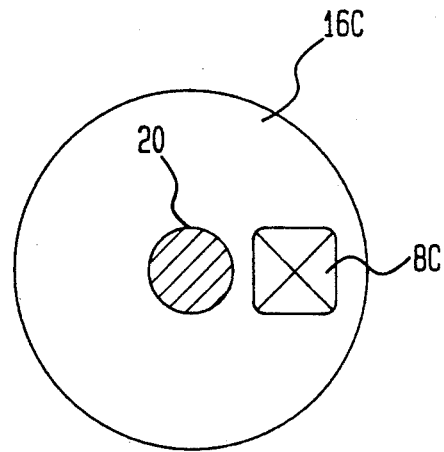
FIG. 5 is a plan view of a bump electrode having one cavity.

FIG. 5 is a plan view (top view) of a bump electrode which is made according to the second embodiment of the invention. In this drawing, the folded wire is omitted. One cavity 8C is made on the surface of the base part 16C. The part number 20 indicates the root of the folded wire. The protrusive part formed by the folded wire is not shown.

Figure 6:
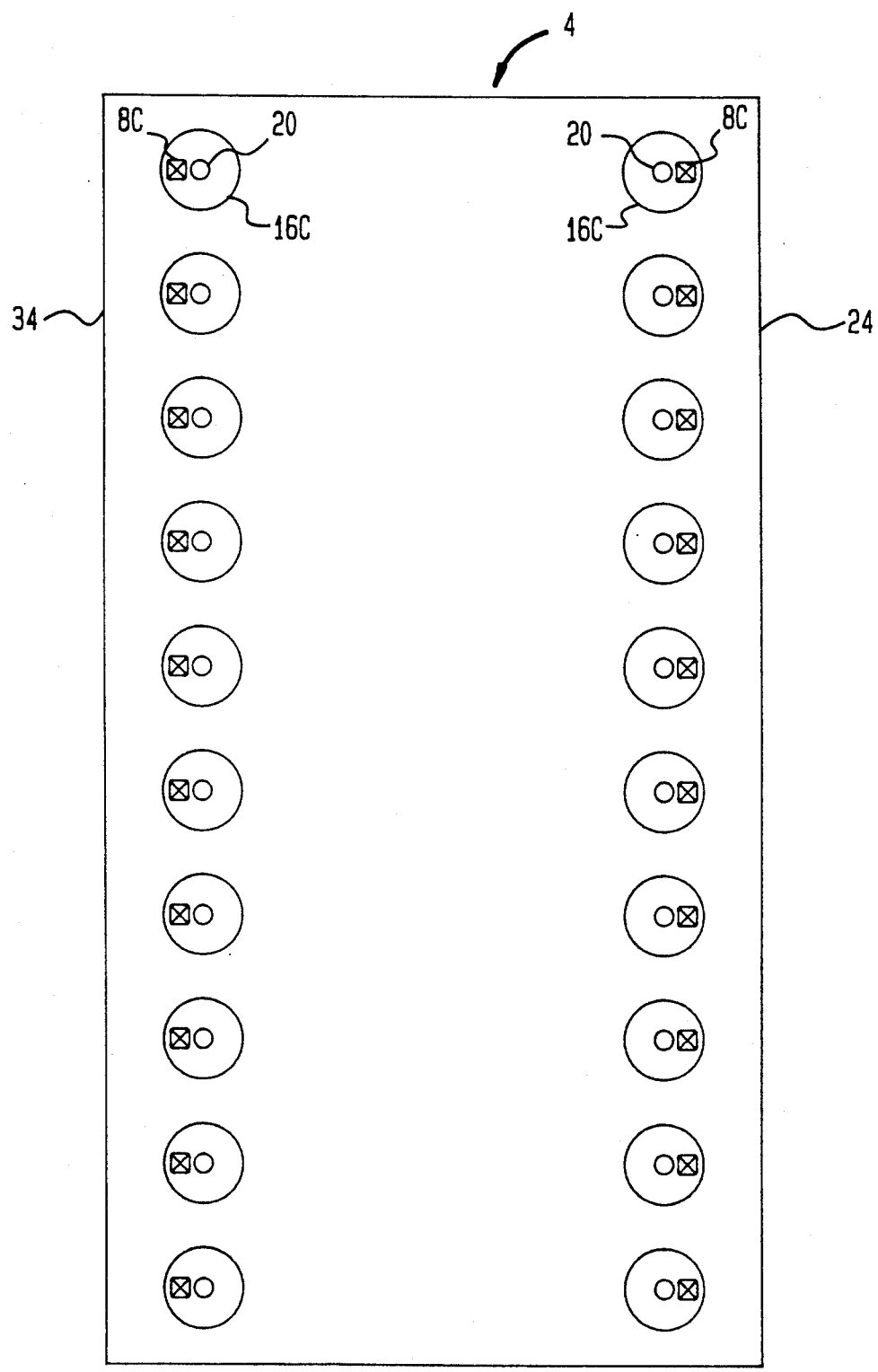

FIG. 6 is a plan view of an LSI chip equipped with two rows of bump electrodes. These two rows are along a set of opposing sides 24, 34. The bump electrodes are provided on the LSI chip 4 by the process of the second embodiment of the invention. Each bump electrode has one cavity 8C. The cavity is formed at the position facing the nearest side (edge) of the chip. As for the bump electrodes in the right row, cavity 8C is formed at the right side of wire root 20 facing the nearest chip side 24. On the other hand, bump electrodes in the left row have a cavity 8c on the left side of wire root 20 facing the nearest chip side 34. The cavities 8C are intended to hold the tail of the folded wire. The protrusion formed by the folded wire is not shown.

FIG. 7 is a schematic plan view of an LSI chip equipped with two rows of bump electrodes. Arrows indicate the direction of the horizontal shift of the capillary during the bump electrode formation (as in the first or second embodiment). The shift direction is vertical to the chip side along which the bump electrodes are disposed, and the capillary moves toward the outside of the chip.

Figure 8:
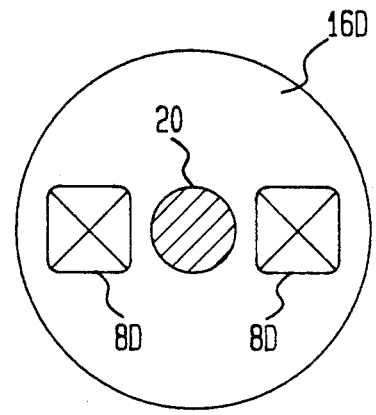
FIG. 8 is a plan view of a bump electrode having two cavities.

For manufacturing an LSI chip with one-cavity bump electrodes as illustrated in FIG. 6, the capillary equipped with a protrusion at the tip thereof must be rotated in response to the position of the cavity to be formed in each bump electrode row. To overcome this problem, a capillary with two or four protrusions symmetrically about the wire outlet can be used. FIG. 8 shows a plan view of a bump electrode prepared using a capillary with two protrusions at the tip. Two cavities 8D are formed at the opposite positions about the wire root 20.

Figure 9:
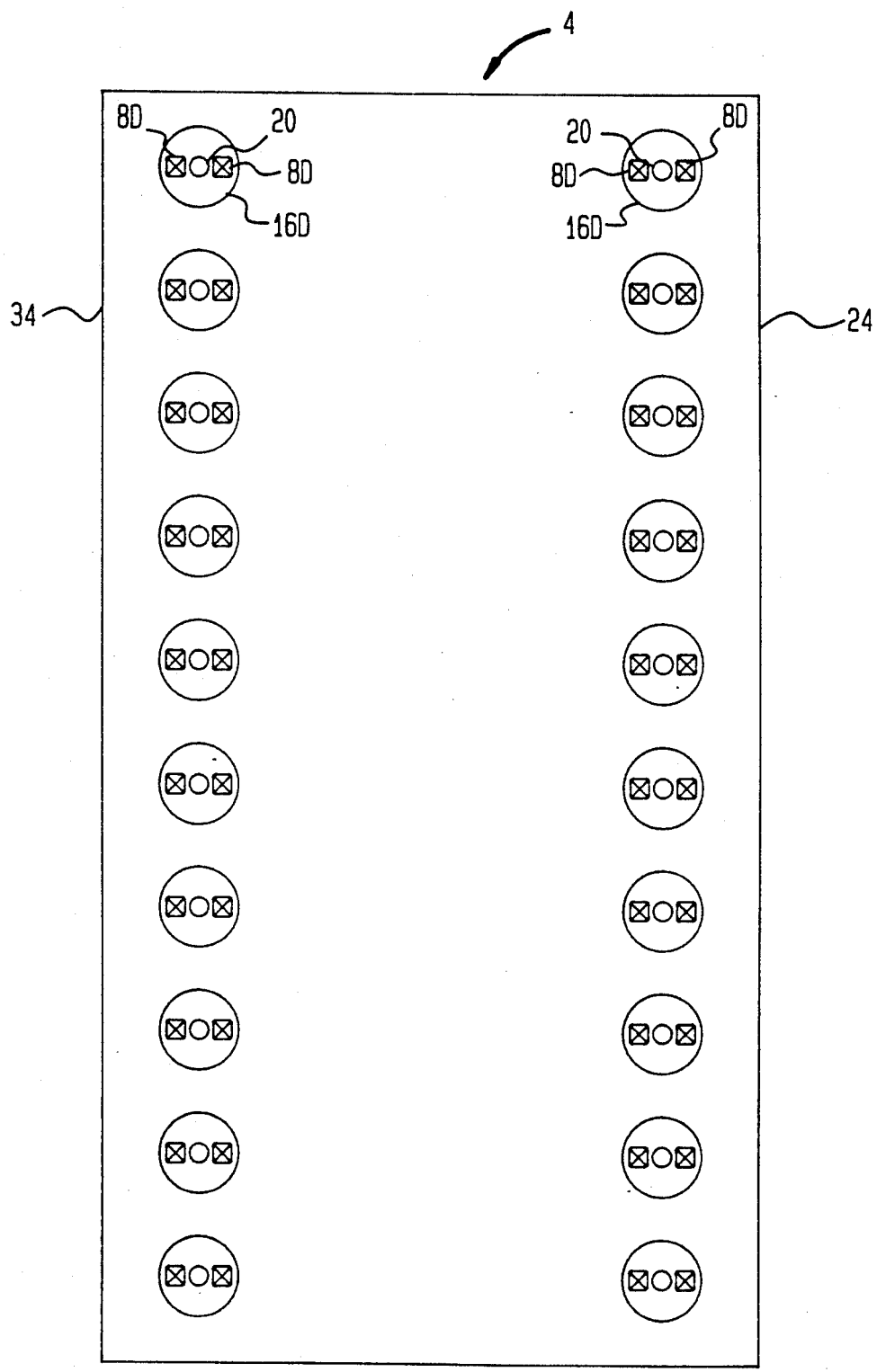
FIG. 9 is a plan view showing the configuration of two rows of bump electrodes on a semiconductor chip.

FIG. 9 illustrates a plan view of an LSI chip with two-cavity bump electrodes in two rows. The LSI chip has a rectangular surface on which the bump electrodes are formed. Each row of the bump electrodes is along and adjacent to one of the longer sides of the LSI chip. The bump electrode disposition is identical to that of the example in FIG. 6. The feature of this embodiment is that each bump electrode has two cavities 8D (as in FIG. 8). In each bump electrode, one cavity faces the nearest chip side and the other cavity faces the inner area of the chip. According to this embodiment, without axial rotation of the capillary, cavities can be formed at the position facing the adjacent chip side in all bump electrodes. The direction of the horizontal shift of the capillary is in accordance with the arrows in FIG. 7, and the wire is folded in the direction of the arrows to form a protrusion (not shown).

Figure 10:
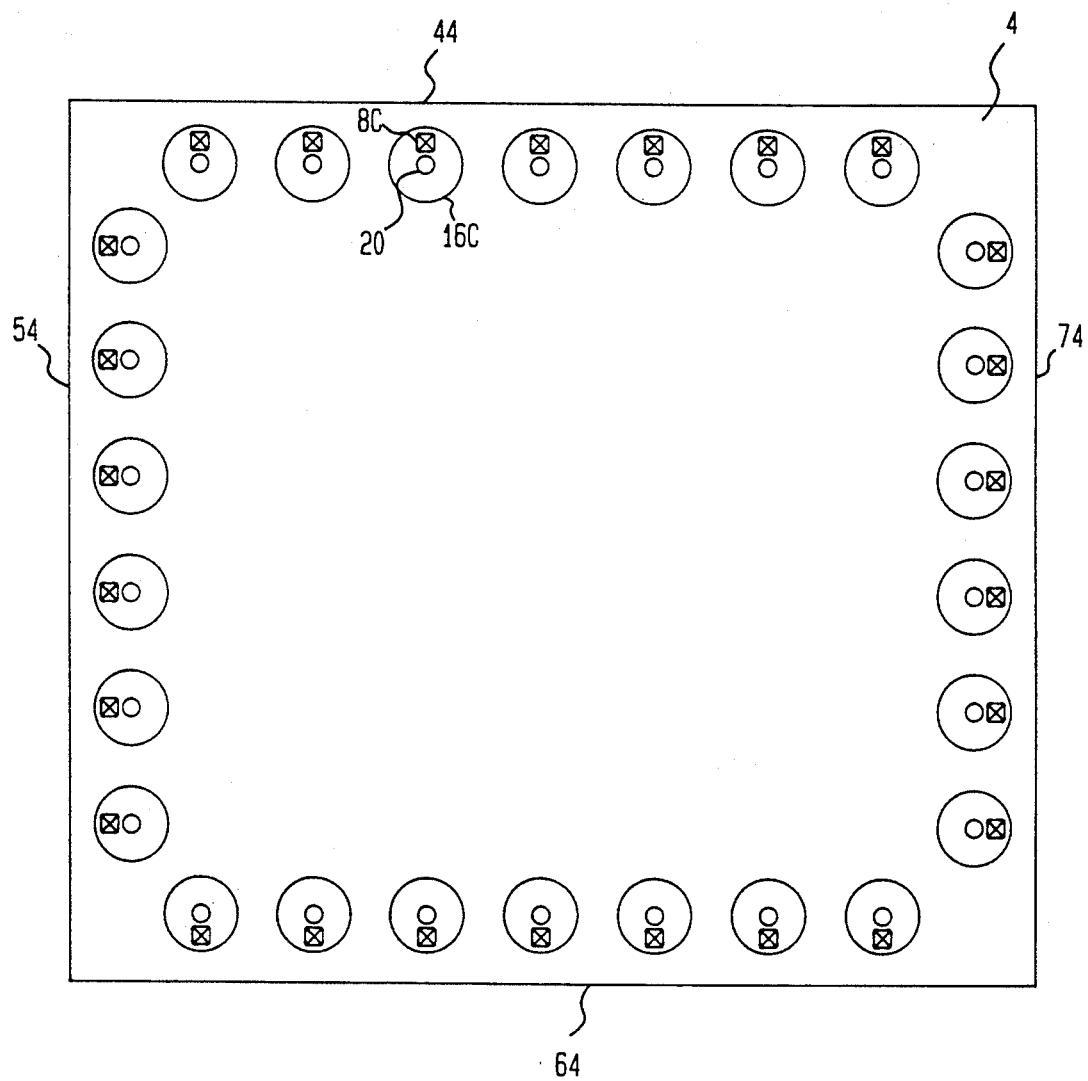
FIGS. 10 and 11 are plan views showing the configuration of four rows of bump electrodes on a semiconductor chip.

FIG. 10 is a plan view of an almost square LSI chip 4 equipped with four lines of bump electrodes along the sides (edges). Each bump electrode has one cavity 8C. The cavity is formed at the position facing the nearest side (edge) of the chip. As for the bump electrodes in the top row, cavity 8C is formed at the upper side of wire root 20 facing the nearest side 44. On the other hand, bump electrodes in the left row, bottom row, and right row have a cavity 8C on the left side, lower side, and right side of wire root 20 facing the nearest chip side 54, 64, 74, respectively. The wire is folded in the direction of the arrows in FIG. 11 to form a protrusion (not shown).

Figure 11:
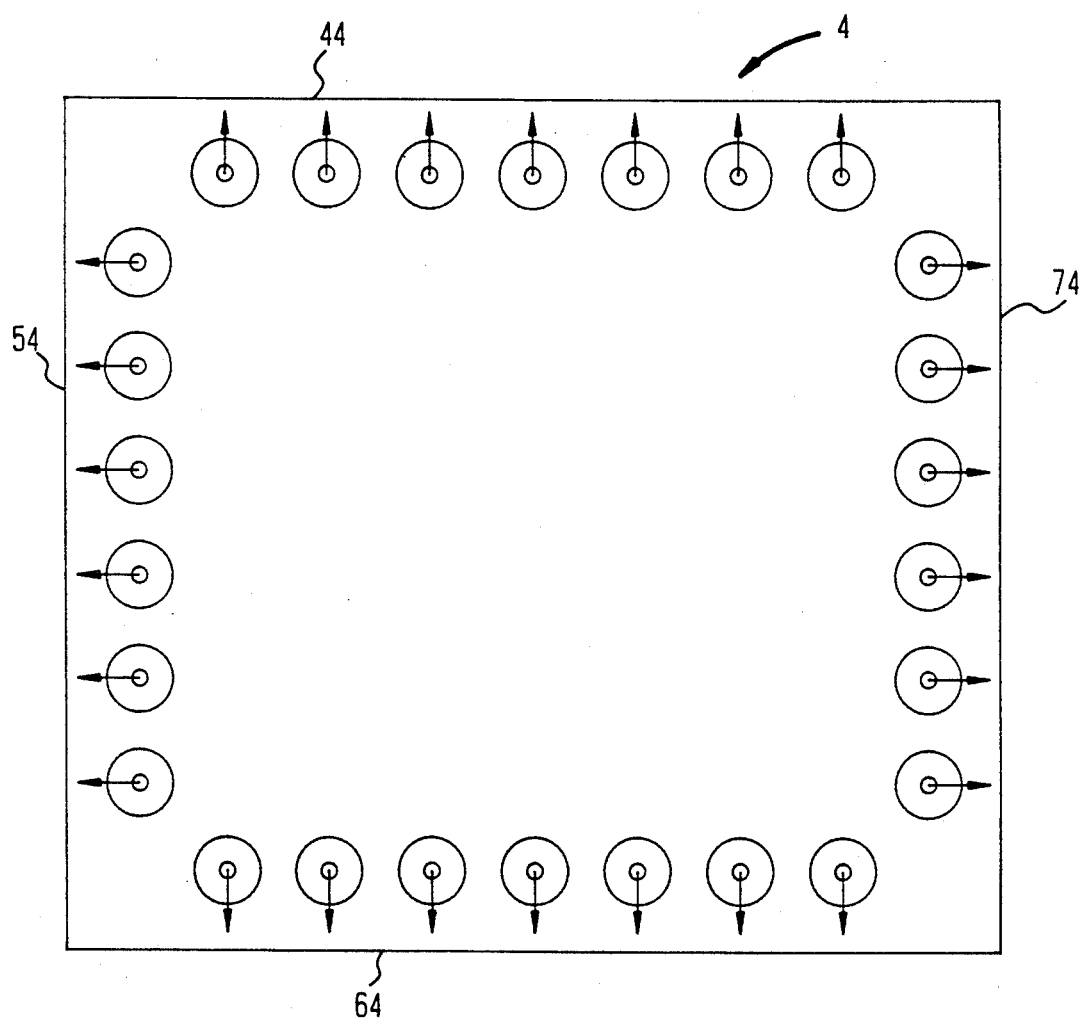

FIG. 11 is a schematic plan view of an LSI chip equipped with four rows of bump electrodes. Arrows indicate the direction of the horizontal shift of the capillary during the bump electrode formation (as in the first or second embodiment). The shift direction is vertical to the chip sides 44, 54, 64, 74 along which the bump electrodes are disposed, and the capillary moves toward the outside of the chip.

Figure 12:
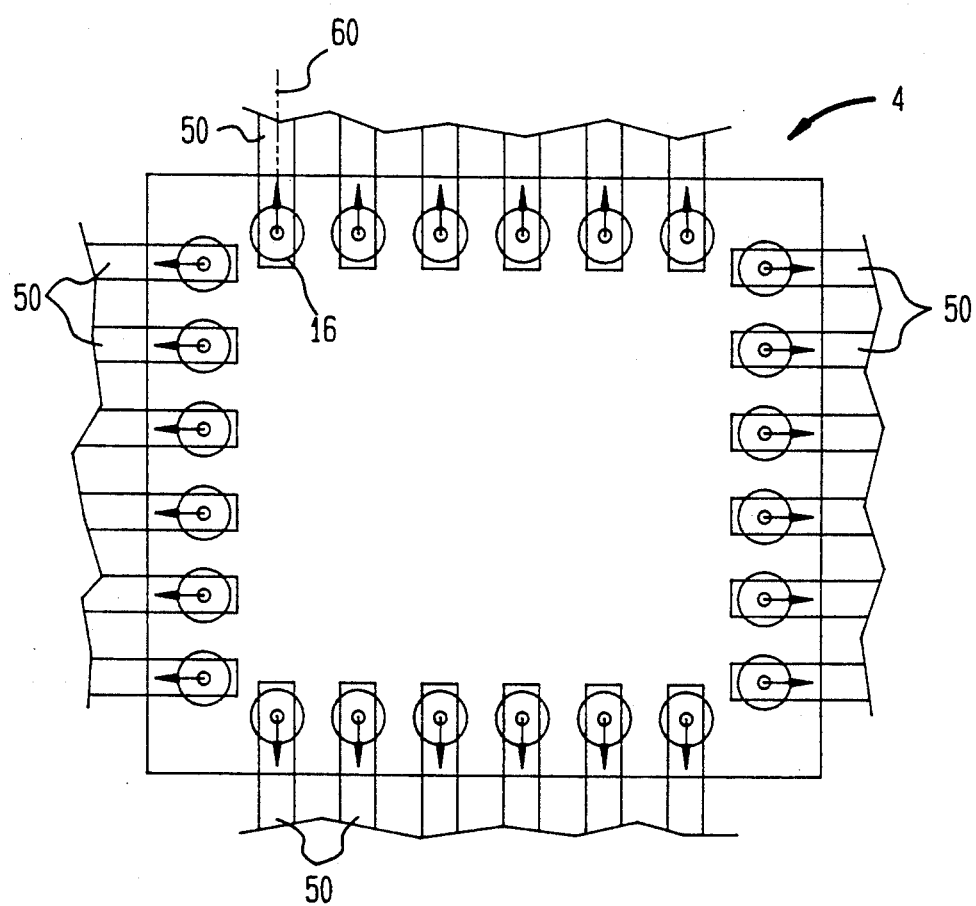
FIG. 12 is a schematic plan view showing the relation of a bump electrode and a lead member.

The reason why the horizontal shift direction of the capillary is determined as mentioned above is described below referring to FIG. 12. FIG. 12 is a schematic plan view of an LSI chip bonded to lead members via bump electrodes. The horizontal shift direction of the capillary (shown by arrows) coincides with the axial direction in the longitudinal direction 60 of the lead 50 to be bonded. The junction of the bump electrode protrusion and the lead is slender in the direction of the horizontal shift, and therefore it is preferable to form the junction in the directional relation as shown in this drawing.

In addition, when this direction of the horizontal shift is matched with a line passing through the center of each bump electrode, out of the radial lines extending from the center of the principal plane of the LSI chip, the same effects as described above may be obtained.

Such method of selecting the direction of the horizontal shift for folding back the wires is also applicable in relation to the electrode pattern of a printed circuit board (PCB) in the case of mounting the LSI chip having bump electrodes on the PCB as so-called flip chips.

Figure 13:
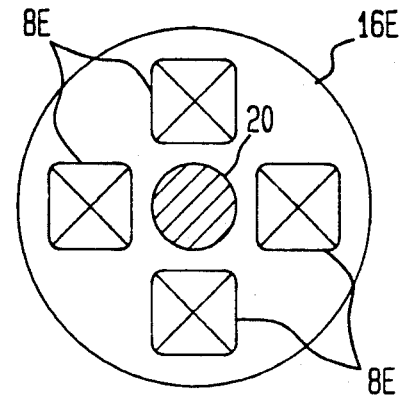
FIG. 13 is a plan view of a bump electrode having four cavities.

FIG. 13 shows a plan view of a bump electrode prepared using a capillary with four protrusions at the tip. Four cavities 8E are formed on the base part 16E at a mutual angle of 90 degrees about the root of the wire 20. The capillary used in this case possesses protrusions at four positions mutually across 90 degrees about the wire outlet.

Figure 14:
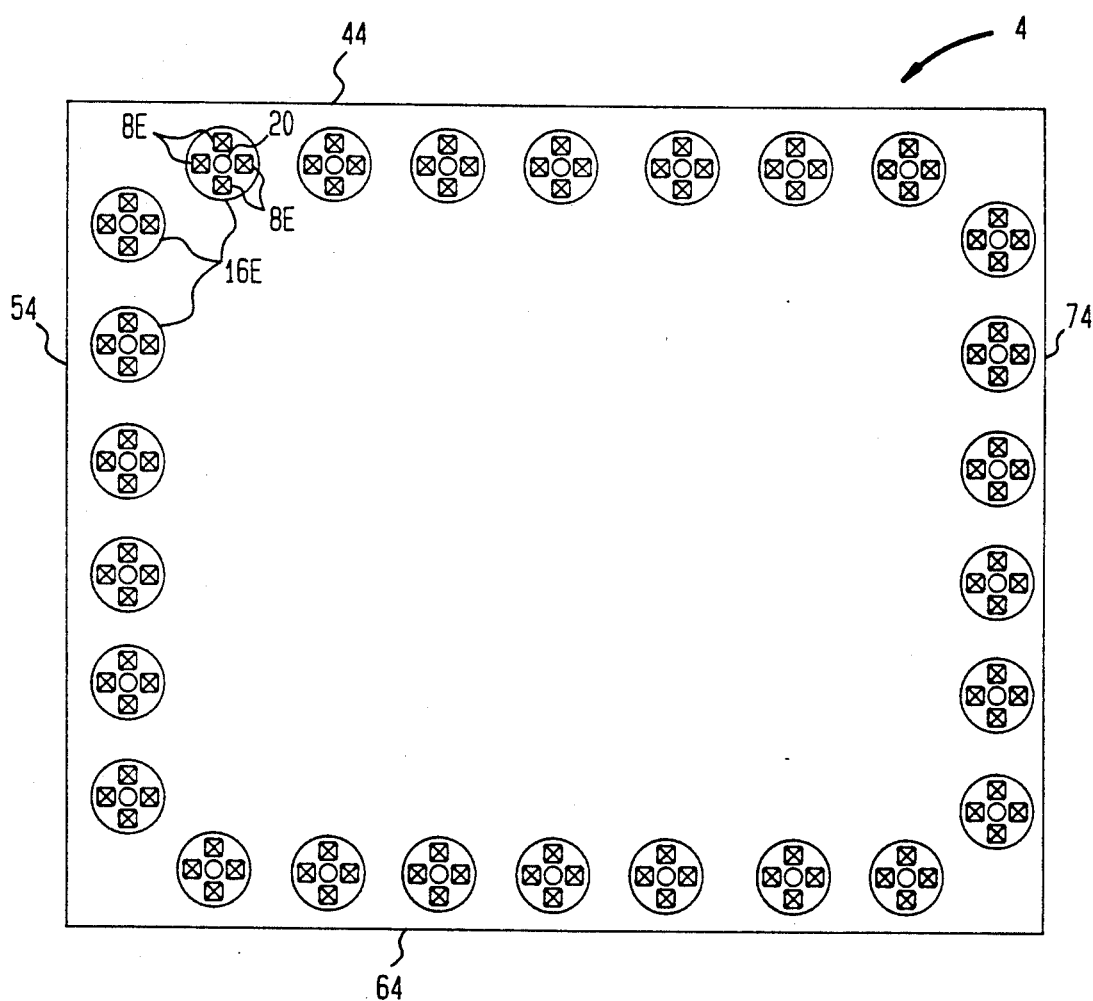
FIG. 14 is a plan view showing the configuration of four rows of bump electrodes on a semiconductor chip.

FIG. 14 illustrates a plan view of an LSI chip with four-cavity bump electrodes in four rows. The LSI chip includes four sides. Each row of the bump electrodes is along and adjacent to one of the four sides of the LSI chip. The bump electrode disposition is identical to that of the example in FIG. 10. The feature of this embodiment is that each bump electrode has four cavities 8E (as in FIG. 13). In each bump electrode, one cavity faces the nearest chip side. According to this embodiment without axial rotation of the capillary, cavities can be formed at the position facing the chip side in all bump electrodes. In addition, the tail of the folded wire can be bonded to the cavity. The direction of the horizontal shift of the capillary is selected in accordance with the arrows in FIG. 11, and the wire is folded in the direction of the arrows to form a protrusion (not shown).

FIGS. 15(a) through 15(d) are process sectional views showing the steps for forming a more compact bump electrode having a protrusive part. An electrode pad 5 on the substrate 4 on which bump electrodes are to be formed is made of an alloy mainly composed of aluminum. The electrode pad 5 has a thickness of 0.8

μm and a size of 94 μm × 94 μm. This electrode pad 5 is usually disposed in the peripheral part of an LSI chip. The electrode pad is isolated from the silicon substrate 4 and the impurity diffusion region in the substrate by way of a silicon dioxide film (not shown), and is connected to a circuit incorporated in an LSI chip as a semiconductor chip.

The machine for forming a bump electrode in this embodiment may be the same as used in the first embodiment. A machine which may be used is, for example, model 1484, manufactured by K&S Corp. As a bonding capillary, a ceramic bonding capillary conventionally used in gold wire nail-head bonding can be used (for example model 41413-0010-330). A gold wire of 30 μm in diameter (purity 99.9999%) is used. An exemplary gold wire is model MHGLP-101 manufactured by Tanaka Denshi Kogyo.

Figure 15A:
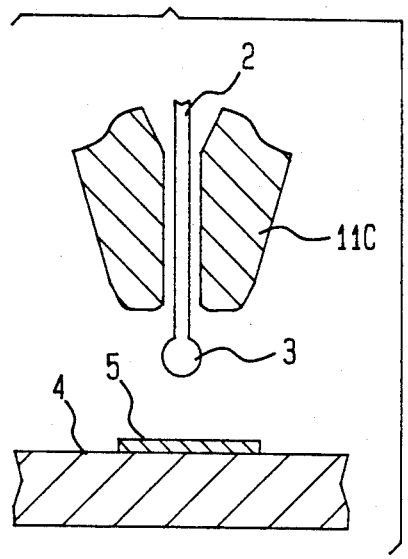
FIGS. 15(a) to 15(d) are sectional views showing the process steps of still another embodiment of the invention.

As shown in FIG. 15(a), a wire 2 is drawn out from the wire outlet at the tip of a capillary 11C, and the wire tip is melted by an electric spark to form a ball 3 (with a swollen head). For the spark, the applied voltage is about 3 to 4 kV, with a gap of about 380 μm.

Figure 15B:
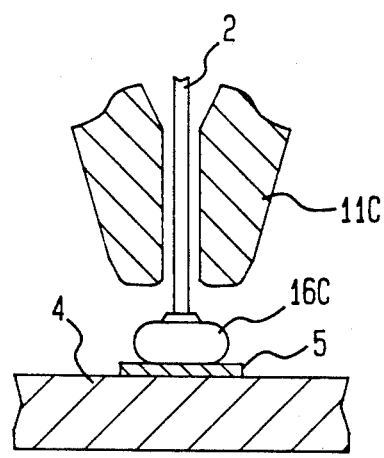

As shown in FIG. 15(b), the ball 3 is pressed against the electrode pad 5 by the tip of the capillary to be bonded. At this step, the LSI chip 4 provided with the electrode pad is heated, to about 180° C. The force of pressing the ball by the capillary is about 45 to 50 grams, and the capillary 11C is further subjected to an ultrasonic vibration of about 60 kHz. When bonded in such a manner, the junction surface of the crushed ball and the electrode pad is circular, about 60 to 80 μm in diameter. The crushed and bonded ball becomes a base part 16C of the bump electrode.

Figure 15C:
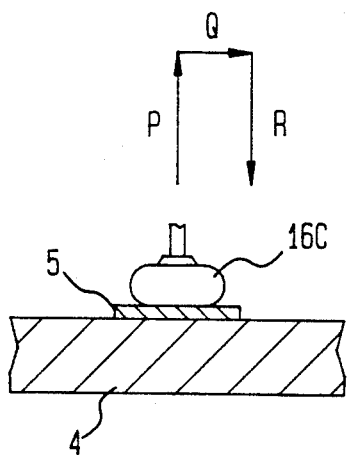

Next, as shown in FIG. 15(c), with the wire extending from the base part and passing into the capillary 11C, the capillary 11C is moved so as to draw a loop trace. The movement of the capillary at this step is a series of individual motions as follows:

P: vertically upward (100 to 400 μm)
Q: shifting horizontally (100 to 120 μm)
R: vertically downward (100 to 400 μm)

Vertical movements in this embodiment are smaller than those vertical movements of the first or second embodiment. This is because, in this embodiment, the wire loop is not formed on a base part of the bump electrode. The horizontal shift is also smaller. This is because, in this embodiment, the capillary should land near the root of the wire.

Figure 15D:
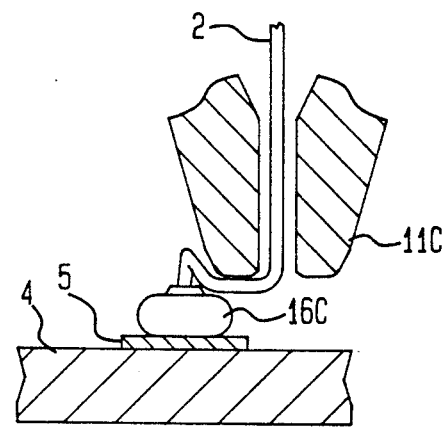
Figure 16A:
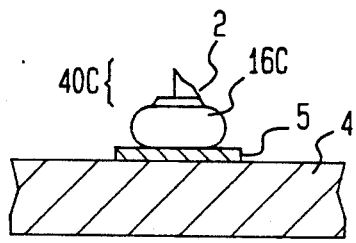
FIGS. 16(a) and 16(b) show sectional views of a bump electrode formed by a method of the invention.
Figure 16B:
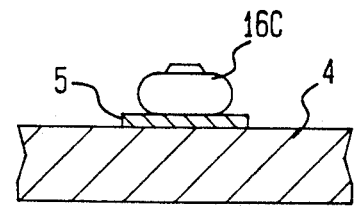

FIG. 15(d) is a sectional view showing the configuration just before the end of the downward motion R. By the final movement of the capillary downward, as shown in FIG. 16(a), the wire extending from the crushed ball is cut off at the vicinity of the root, and is left over as a small protrusion. The bump electrode comprises a base 16C and a small protrusion 40C. The height of the bump electrode formed in this method is about 45 to 65 μm. By the method disclosed in this embodiment, it is possible to form a low-profiled bump electrode with excellent height uniformity. As shown in FIG. 16(b), a bump electrode without a protrusion can be obtained by pressing the protrusion.

Figure 17A:
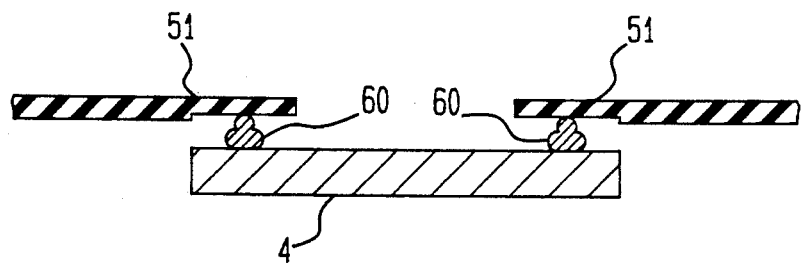
FIGS. 17(a) to 17(e) are sectional views showing the process steps of an alternative embodiment of the invention.
Figure 17B:
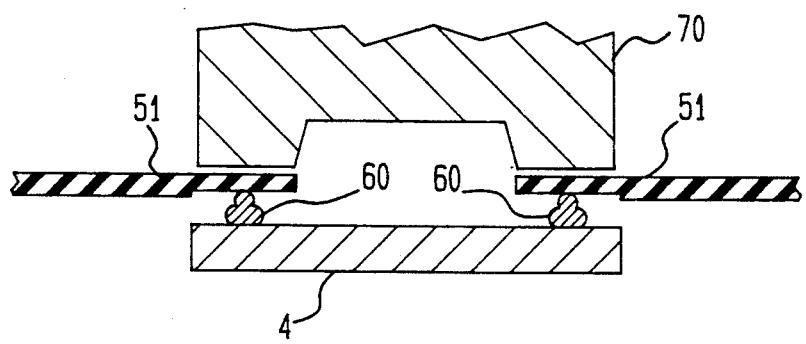
Figure 17C:
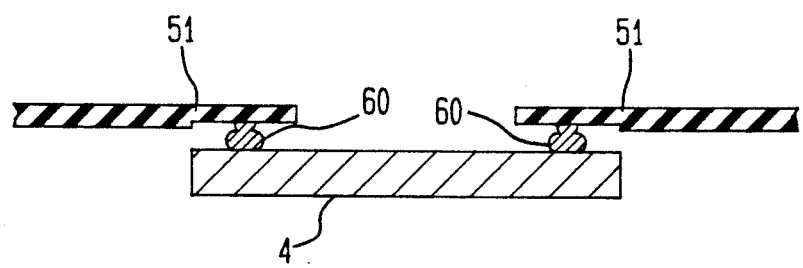
Figure 17D:
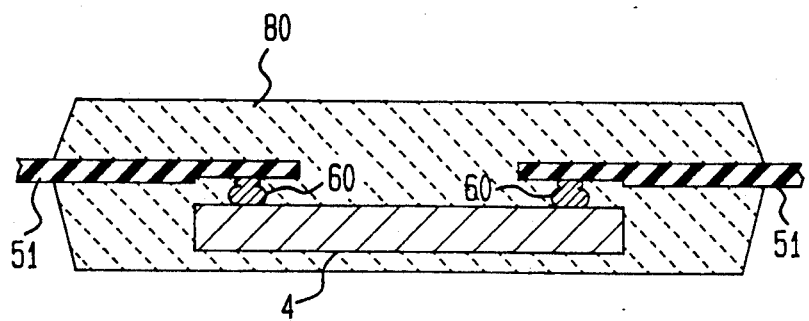
Figure 17E:
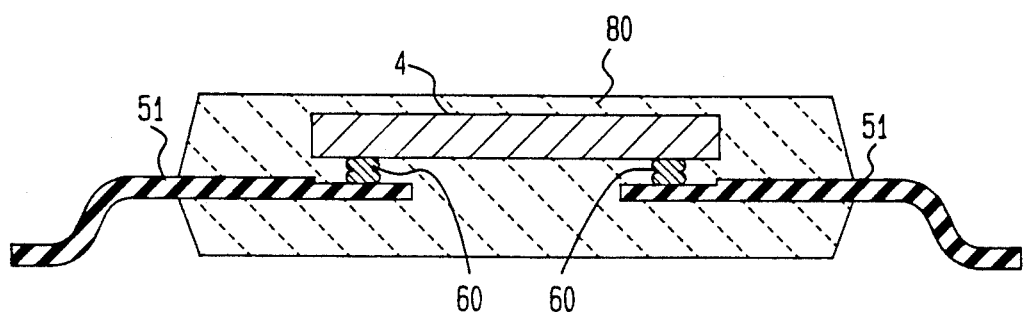

FIG. 17(e) is a sectional view showing a resin sealed type semiconductor device obtained by mold sealing of the LSI chip possessing bump electrodes formed in the foregoing embodiments. On the LSI chip, bump electrodes in a two-stage profile are formed. The two-stage profile bump electrode is the bump electrode composed of the base portion joined to the base pad part and the portion projecting upward from the top surface of the base part (the protrusion). Each bump electrode 60 is connected to the inner end of the lead 51. The outer end of the lead 51 is drawn out from the side of the resin part 80, and is formed in a desired shape. The material of the lead is an iron-nickel alloy such as Alloy 42. The lead thickness should be preferably 0.07 mm to 0.10 mm, and the connecting part with the bump electrode of the inner end of the lead is preferably formed thinner by pressing or etching, as in this embodiment, than other parts (about 0.04 mm to 0.06 mm).

FIGS. 17(a) to 17(d) are sectional views showing a series of processes for manufacturing the device shown in FIG. 17(e). FIG. 17(a) shows the positioned state of the lead members of the lead frame in the LSI chip having two-stage profile bump electrodes. When the bump electrodes are made of gold, the surface of the lead in the part contacting with the bump electrode is plated with gold or tin.

Figure 19:
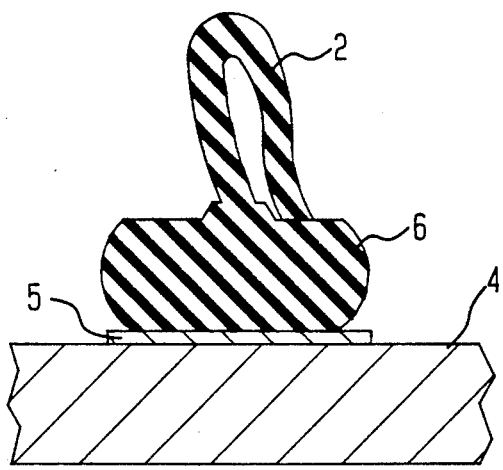
FIG. 19 is a sectional view of a bump electrode according to the prior art.

Next, as shown in FIG. 17(b), by pressing the leads 51 to the bump electrodes 60 by means of heat bonding tool 70, the leads 51 and the bump electrodes 60 are joined. At this time, the tool surface temperature is about 200° to 300° C. When the number of bump electrodes is 180, the force for gang bonding is about 80 to 130 grams. It is preferable to heat the chip stage to about 200° C. Since the bump electrode is a two-stage protrusion, damage to the LSI chip is reduced. Moreover, due to the structure of bonding with the lead member at the protrusion of the bump electrode in two-stage protrusion shape, the electrode pitch and lead pitch can be narrowed as compared with the prior art, and it is possible to apply this feature to the mounting of LSI chips possessing an extremely large number of electrodes. The package structure mentioned herein may be also applied to the packaging of LSI chips having two-stage protrusion profile bump electrodes formed by the prior art (as in FIG. 19).

The assembly composed in the above process is sealed with resin by a successive transfer mold method, thus making the structure as shown in FIG. 17(d). The sealing resin may be KMC-184 manufactured by Shin-etsu Kagaku. The molding temperature is about 170° C. The resin part covers at least the semiconductor chip 4 and electrical junction of bump electrodes 60 and leads 51. The other end of the lead is drawn outside of the resin body 80 to be an external lead. The thickness of the resin body is about 1.0 mm in the conventional package. This may be reduced to 0.5 to 0.7 mm. The external lead may be formed, if possible in terms of strength, in a gull-wing style (as shown in FIG. 17(e)), or it may be kept straight, and its tip may be bonded to the terminal electrode of a printed circuit board (PCB) when mounting on a PCB. If there is a part for mutually coupling external leads, that is, a so-called dam bar, it may be cut off by press or laser processing.

Some preferred embodiments of the present invention have been specifically disclosed herein for purpose of illustration. It is apparent that many variations and modifications may be made upon the specific method disclosed herein. It is intended to cover all of these variations and modifications which fall within the scope of this invention as defined by the appended claims.

What is claimed:

1. A method of forming a bump electrode comprising the steps of:

forming a swollen head at the tip of a metal wire drawn out from the tip of a capillary;

pressing the swollen head to a pad electrode on a semiconductor chip by the tip of said capillary to crush said swollen head, thereby bonding said swollen head and said pad electrode, wherein the crushed swollen head part becomes a base part of said bump electrode, and a cavity is formed on the top surface of said base part;

moving said capillary in a loop forming motion above said base part, and folding back the wire extending from said base part toward the base part;

pressing and bonding the wire to said cavity by the tip of the capillary to form a loop of wire; and cutting off the wire further extending from said bonded part thereby leaving the loop of wire as a protrusion on said base part.

2. A method of forming a bump electrode of claim 1, wherein said loop-forming motion of the capillary comprises the steps of:

moving the capillary vertically upward;
shifting the capillary horizontally; and
moving the capillary vertically downward 3. A method of forming a bump electrode according to claim 2, wherein the direction of said horizontal shift of said capillary being vertical with respect to and toward the nearest side of the semiconductor chip.

4. A method of forming a bump electrode according to claim 1, wherein a point at which the wire initially extends from said swollen head is defined as a wire root and wherein said cavity is annularly formed surrounding the wire root.

5. A method of forming a bump electrode according to claim 1, wherein a point at which the wire initially extends from said swollen head is defined as a wire root and wherein said cavity is formed only at one position around the wire root.

6. A method of forming a bump electrode according to claim 5, wherein a point at which the wire initially extends from said swollen head is defined as a wire root and wherein said semiconductor chip includes a plurality of sides, one of said sides is located closest to said wire root, and said cavity is located closest to said one side located closest to said wire root.

7. A method of forming a bump electrode according to claim 1, wherein a point at which the wire initially extends from said swollen head is defined as a wire root and wherein a further cavity is formed at a side of the wire root opposite the cavity.

8. A method of forming a bump electrode according to claim 7, wherein said semiconductor chip includes a plurality of sides, one of said sides is located closest to said wire root, and said cavity is located closest to said one side located closest to said wire root.

9. A method of forming a bump electrode according to claim 7, wherein said semiconductor chip has a rectangular surface on which a plurality of said bump electrodes are formed, said bump electrodes are disposed in two rows, each row of said two rows of bump electrodes is along and adjacent to one of two longer sides of said rectangular surface, and said cavity is located facing said adjacent longer side.

10. A method of forming a bump electrode according to claim 1, wherein a point at which the wire initially extends from said swollen head is defined as a wire root and wherein three further cavities are formed with said cavity and said further cavities at four positions at a spacing of 90 degrees mutually about the wire root.

11. A method of forming a bump electrode according to claim 10, wherein said semiconductor chip includes a plurality of sides, one of said sides is located closest to said wire root, and said cavity is located closest to said one side located closest to said wire root.

12. A method of forming a bump electrode according to claim 10, wherein said semiconductor chip includes four sides, a plurality of said bump electrodes are formed in four rows, each row of said four rows of bump electrodes is along and adjacent to one of said four sides, and said cavity is located facing said adjacent side.

13. A method of forming a bump electrode comprising the steps of:

forming a swollen head at the tip of a metal wire drawn out from the tip of a capillary, defining a wire root at a point where the swollen head and the wire connect;

pressing said swollen head to a pad electrode of a semiconductor chip by the tip of said capillary to crush said swollen head, thereby bonding said crushed swollen head and said pad electrode, wherein said crushed swollen head becomes a base part of said bump electrode;

moving said capillary in a loop forming motion above said base part, said loop forming motion comprising an upward movement and a downward movement and by the downward movement of the capillary cutting off the wire extending from said base part at the vicinity of the wire root, thereby forming a protrusion substantially at the center of the top surface of the base part.

14. A method of forming a bump electrode according to claim 13, wherein said loop-forming motion of said capillary comprises the steps of:

moving the capillary vertically upward;
shifting the capillary horizontally; and
moving the capillary vertically downward.

* * * * *